(12) United States Patent
Karavakis et al.

(10) Patent No.: US 7,170,306 B2
(45) Date of Patent: Jan. 30, 2007

(54) CONNECTING A PROBE CARD AND AN INTERPOSER USING A COMPLIANT CONNECTOR

(75) Inventors: Konstantine N. Karavakis, Pleasanton, CA (US); Tom T. Nguyen, San Jose, CA (US)

(73) Assignee: Celerity Research, Inc., San Jose, CA (US)

( * ) Notice: Subject to any disclaimer, the term of this patent is extended or adjusted under 35 U.S.C. 154(b) by 156 days.

(21) Appl. No.: 10/386,875

(22) Filed: Mar. 12, 2003

(65) Prior Publication Data

US 2004/0178812 A1    Sep. 16, 2004

(51) Int. Cl.
G01R 31/02 (2006.01)
H01R 43/00 (2006.01)

(52) U.S. Cl. .................. 324/755; 29/825; 29/831
(58) Field of Classification Search ............ 324/754, 324/761
See application file for complete search history.

(56) References Cited

U.S. PATENT DOCUMENTS

| | | | |
|---|---|---|---|
| 4,289,384 A | 9/1981 | Samek | |
| 5,124,639 A | 6/1992 | Carlin et al. | |
| 5,127,837 A * | 7/1992 | Shah et al. | 439/71 |
| 5,180,976 A | 1/1993 | Van Loan et al. | |
| 5,229,322 A | 7/1993 | Chu et al. | |
| 5,247,250 A * | 9/1993 | Rios | 324/754 |
| 5,399,982 A | 3/1995 | Driller et al. | |
| 5,434,513 A | 7/1995 | Fujii et al. | |
| 5,453,701 A | 9/1995 | Jensen et al. | |
| 5,748,007 A | 5/1998 | Gaschke | |
| 5,783,461 A | 7/1998 | Hembree | |
| 5,791,914 A | 8/1998 | Loranger et al. | |
| 5,828,226 A | 10/1998 | Higgins et al. | |
| 5,847,929 A | 12/1998 | Bernier et al. | |
| 5,894,173 A | 4/1999 | Jacobs et al. | |
| 6,078,186 A | 6/2000 | Hembree et al. | |
| 6,090,636 A | 7/2000 | Geusic et al. | |
| 6,174,172 B1 * | 1/2001 | Kazama | 439/66 |
| 6,220,870 B1 * | 4/2001 | Barabi et al. | 439/71 |
| 6,229,322 B1 | 5/2001 | Hembree | |
| 6,242,931 B1 | 6/2001 | Hembree et al. | |
| 6,256,202 B1 * | 7/2001 | Murphy | 361/704 |
| 6,285,081 B1 | 9/2001 | Jackson | |
| 6,286,208 B1 | 9/2001 | Shih et al. | |
| 6,287,878 B1 | 9/2001 | Maeng et al. | |
| 6,460,170 B1 | 10/2002 | Shaeffer et al. | |
| 6,471,538 B2 | 10/2002 | Zhou et al. | |
| 6,483,328 B1 | 11/2002 | Eldridge et al. | |

FOREIGN PATENT DOCUMENTS

JP        360001840 A    1/1985

* cited by examiner

Primary Examiner—Ernest Karlsen
(74) Attorney, Agent, or Firm—David T. Millers

(57) ABSTRACT

One embodiment of the present invention is a method for fabricating a structure useful for testing circuits that includes steps of: (a) aligning a first side of a connector-holder comprised of electrical connectors having retractable ends that are extendable out of the first side of the connector-holder and having retractable ends that are extendable out of a second side of the connector-holder with a substrate; and (b) connecting ends extendable out of the first side to pads on the substrate to form the structure.

12 Claims, 7 Drawing Sheets

186

187

188

CONNECTING A PROBE CARD AND AN INTERPOSER USING A COMPLIANT CONNECTOR

TECHNICAL FIELD OF THE INVENTION

One or more embodiments of the present invention pertain to: (a) one or more structures useful, for example and without limitation, for testing circuits, for example and without limitation, integrated circuits ("ICs") at a wafer level; and (b) one or more methods for fabricating such structures.

BACKGROUND OF THE INVENTION

As is known, a substrate (sometimes also referred to in the art as an interposer) is a device that provides a fan-out between I/O (i.e., electrical inputs and outs) of a circuit, for example and without limitation, an integrated circuit ("IC") and a Probe Card to enable testing of the IC, for example, at a wafer level. Such a substrate may be a rigid substrate, a semi-flex substrate, a flex substrate, and so forth, and such substrates often have a relatively low cost when compared to that of the Probe Card.

As IC geometries have decreased in size dramatically since such devices were first introduced several decades ago, so too have geometries associated with wiring connections to their I/O. For example, present designs include the use of bumped wafer pad pitches of 200 μm or less. In order to test such ICs, one is required to utilize high density interconnect ("HDI") substrates having matching fine connector pitches.

Substrates available today, and the manner in which they are used, are problematic for two basic reasons. First, manufacturing techniques used to fabricate such substrates and to connect them to Probe Cards typically require multiple expensive steps. Second, if one of the connectors on the substrate gets damaged, it cannot be replaced, for the most part, or is difficult or expensive to rework. In addition, whenever the substrate wears out, or gets damaged, one typically has to throw away the Probe Card together with the substrate. In particular, this is because, due to manufacturing techniques used to fabricate such substrates and to connect them to Probe Cards, it is a prohibitively lengthy and costly process to separate the substrate from the Probe Card.

In light of the above, there is a need in the art for: (a) one or more structures useful, for example and without limitation, for testing circuits, for example and without limitation, ICs at a wafer level that solve one or more of the above-identified problems; and (b) one or more methods for fabricating such structures.

SUMMARY OF THE INVENTION

One or more embodiments of the present invention satisfy one or more of the above-identified needs in the art. In particular, one embodiment of the present invention is a method for fabricating a structure useful for testing circuits that comprises steps of: (a) aligning a first side of a connector-holder comprised of electrical connectors having retractable ends that are extendable out of the first side of the connector-holder and having retractable ends that are extendable out of a second side of the connector-holder with a substrate; and (b) connecting ends extendable out of the first side to pads on the substrate to form the structure. In further particular, another embodiment of the present invention is a method for fabricating a structure useful for testing circuits that comprises steps of: (a) aligning a second side of a connector-holder comprised of electrical connectors having retractable ends that are extendable out of a first side of the connector-holder and having retractable ends that are extendable out of a second side of the connector-holder with a Probe Card; (b) connecting the connector-holder to the Probe Card; (c) aligning a substrate having bevels in at least two edges with the first side of the connector-holder; (d) aligning a clamp over the substrate with the connector-holder, the clamp being adapted to fit over the substrate and the connector-holder, the clamp further comprising a substrate alignment mechanism; and (e) connecting the clamp to the connector-holder.

DETAILED DESCRIPTION

As is known, circuits such as, for example and without limitation, integrated circuits ("ICs"), are fabricated on wafers, and the circuits are tested by applying electrical signals to circuit inputs and analyzing electrical signals produced at circuit outputs (such circuit inputs and outputs may be bumped or not). As is also known, a Probe Card that provides an interface between the circuit inputs and outputs ("I/O") on the wafer and a Tester is used to perform such testing.

As the density of I/O of ICs has increased, it has become common to connect the Probe Card to a substrate (sometimes referred to in the art as an interposer) having an array of contactors (for example and without limitation, 12–50 μm high structures that are sometimes also referred to in the art as posts) on a top or testing side (i.e., a side that contacts the IC on the wafer) and having a ball grid array ("BGA") of pads on a bottom side (i.e., a side that contacts the Probe Card). The contactors are wired through the substrate, and each wire ends at a pad in the BGA on the bottom side of the substrate. The array of contactors has a pitch and density (sometimes referred to as a footprint) that matches that of the IC, and the BGA has a pitch and density that matches that of the Probe Card. Substrates used to test present and future ICs, may be high density interconnect ("HDI") substrates where the pitch of the array of contactors could be as small as 125 μm or less. Thus, one or more embodiments of the present invention relate to methods for assembling a structure used to test circuits, for example and without limitation, ICs, whether bumped or not, on a wafer, and one or more further embodiments relate to the assembled structure itself.

In particular, one or more embodiments of the present invention are methods for connecting a substrate, for example and without limitation, a rigid substrate, a flex substrate, a semi-flex substrate, a silicon/glass substrate (for example and without limitation, a silicon/glass structure that includes MEMS-type spring contactors), and so forth, to a Probe Card to provide structures that are used, for example and without limitation, to test circuits, for example and without limitation, integrated circuits ("ICs"), whether bumped or not, on a wafer. Advantageously, in accordance with one or more embodiments of the present invention, structures are produced that may be used cost effectively for testing because, among other reasons, such substrates may be replaced easily and rapidly with a new ones whenever the substrates are damaged or worn. In addition, advantageously, in accordance with one or more embodiments of the present invention, structures are produced having a relatively short distance between the substrate and the Probe Card, whereby electrical connections between the substrate and the Probe Card have better electrical properties than those of structures produced using prior art methods.

Figure 1:
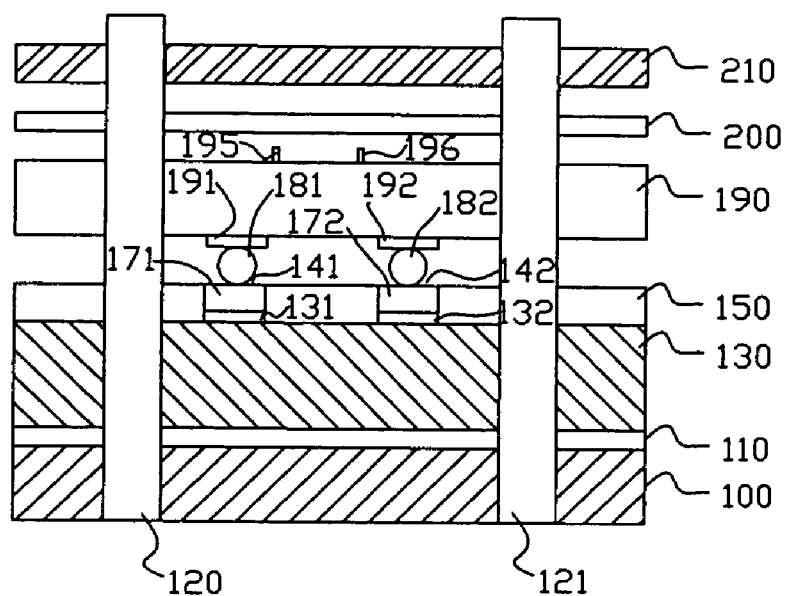
FIG. 1 is a cross sectional view that shows a pinalignment fixture used to connect a substrate to a Probe Card in accordance with one or more embodiments of the present invention prior to re-flow.

The following describes a method ("Method I") for connecting a substrate to a Probe Card (i.e., for connecting BGA pads of a substrate to BGA pads of a Probe Card) in accordance with one or more embodiments of the present invention, which substrate can be, for example and without limitation, a rigid substrate, a flex substrate, or a semi-flex substrate. FIG. 1 is a cross sectional view that shows a pinalignment fixture used to carry out Method I prior to re-flow.

As shown in FIG. 1, the pinalignment fixture includes base plate 100. Base plate 100 is, for example and without limitation, an aluminum base plate, a Durostone® composite material base plate, or a base plate that is fabricated using any one of a number of other materials that are well known to those of ordinary skill in the art, which materials are relatively stable at processing temperatures of subsequent steps of Method I. In accordance with one or more embodiments of the present invention, base plate 100 has an area of about the same size as that of Probe Card 130, and base plate 100 has a thickness in a range, for example and without limitation, from about 5.0 mm to about 7.0 mm. As further shown in FIG. 1, the pinalignment fixture includes alignment pins that are affixed to base plate 110 such as alignment pins 120 and 121. In accordance with one or more embodiments of the present invention, the alignment pins have a diameter in a range, for example and without limitation, from about 0.7 mm to about 1.1 mm diameter. As one can readily appreciate, the pinalignment fixture may include, for example and without limitation, three (3) or four (4) such alignment pins.

In a first, optional step of Method I, release film 110 such as, for example and without limitation, a Mylar film or a Teflon film, is aligned with, and placed over, base plate 100 of the pinalignment fixture (holes in release film 110 match the positions of the alignment pins such as pins 120 and 121). Next, Probe Card 130 is aligned with, and placed over, release film 110 on the pinalignment fixture (holes in Probe Card 130 match the positions of the alignment pins such as pins 120 and 121). Vias 141 and 142 are formed in a commercially available "interconnector alignment" film such as, for example and without limitation, polyimide film 150 having adhesive (not shown) (for example and without limitation, epoxy, acrylic, epoxy-acrylic, and so forth) on one, or both, side(s), and a release film (not shown) (for example and without limitation, a Mylar film or Teflon film) disposed on the adhesive side. Vias 141 and 142 may be formed in accordance with any one of a number of methods that are well known to those of ordinary skill in the art such as, for example and without limitation, by drilling, punching, lasing, and so forth. The locations of vias 141 and 142 in polyimide film 150 match the locations of BGA pads 131 and 132, respectively, on the top side of Probe Card 130. Although not shown as such in FIG. 1, the cross sectional area of vias 141 and 142 is typically larger that the cross sectional areas of pads 131 and 132, respectively. As one can readily appreciate, the step of fabricating the interconnector alignment film (i.e., polyimide film 150) may take place at any time before it is needed to be placed in use. Next, polyimide film 150 is aligned with, and placed over, Probe Card 130 on the pinalignment fixture (holes in polyimide film 150 match the positions of the alignment pins such as pins 120 and 121). Next, weight 210, for example, an aluminum or stainless steel plate having a thickness in a range, for example and without limitation, from about 10 mm to about 12.7 mm, and having an area of about the same size as that of Probe Card 130 is aligned with, and placed over polyimide film 150 on the pinalignment fixture to apply pressure to polyimide film 150 (holes in plate 210 match the positions of the alignment pins such as pins 120 and 121). Next, polyimide film 150 is laminated to Probe Card 130 by, for example and without limitation, baking in an oven. The oven temperature is in a range, for example and without limitation, from about 150° C. to about 200° C., the pressure exerted by the weight of plate 210 is in a range, for example and without limitation, from about 14 kg/cm$^2$ to about 28 kg/cm$^2$, and the time spent in the oven is in a range, for example and without limitation, from about 1 hour to about 2 hours. Next, weight 210 is removed.

Next, vias 141 and 142 are filled with paste 171 and 172, respectively, using, for example and without limitation, the release film of polyimide film 150 as a mask. Paste 171 and 172 may be any one of a number of conductive pastes that are well known to those of ordinary skill in the art such as, for example, and without limitation, a Ag conductive paste, a Au conductive paste, a Cu conductive paste, and so forth, or it may be any one of a number of solder pastes that are well known to those of ordinary skill in the art. Paste 171 and 172 may be applied utilizing any one of a number of methods that are well known to those of ordinary skill in the art such as, for example and without limitation, methods utilizing a dispensing machine, methods utilizing screen-printing, methods utilizing a squeegee, and so forth. Also, in accordance with one or more further embodiments of the present invention, paste 171 and 172 can be a compliant, conductive paste. Such a compliant conductive paste may be any one of a number of such products that are well known to those of ordinary skill in the art such as, for example and without limitation, an elastomer such as a silicone elastomer having conductive particles embedded therein. The use of a compliant conductive paste may be advantageous in that the resulting structure (sometimes referred to as a "lay-up") may be able to take up vertical movements or movements in a Z-direction caused during testing by non-planarity of contactors on the substrate, pads on the substrate, pads on the Probe Card, and/or I/O contacts on the wafer. Next, the release film is removed.

Next, a stencil (sometimes referred to in the art as a solder ball stencil—not shown) that is fabricated in accordance with any one of a number of methods that are well known to those of ordinary skill in the art is aligned with, and placed, over polyimide film 150 on the pinalignment fixture (holes in the stencil match the positions of the alignment pins such as pins 120 and 121); the edges of the stencil could have a corral formed thereon, for example, a corral of tape, to trap balls within the confines of the stencil. The holes in the stencil are slightly larger than the largest cross section of interconnectors, for example and without limitation, balls (described below), so the interconnectors, for example and without limitation, balls, will fall through the holes in the stencil when the stencil is removed. In accordance with one or more embodiments of the present invention, balls 181 and 182 shown in FIG. 1 are comprised of a rigid core, for example and without limitation, a solid copper (Cu) core, and a coating, for example and without limitation, a solder coating such as, for example and without limitation, a eutectic solder coating. Next, balls 181 and 182 are placed over the stencil, and the stencil is removed. The diameter of the core of balls 181 and 182 is in a range, for example and without limitation, from about 5 mils to about 10 mils, and the coating has a thickness in a range, for example and without limitation, from about 20 µm to about 25 µm. The diameter of the core of balls 181 and 182 ought to be larger than the thickness of polyimide film 150 so that the core of balls 181 and 182 can contact pads 191 and 192, respectively, on substrate 190 and pads 131 and 132, respectively, on Probe Card 130.

Next, substrate 190 (for example and without limitation, a rigid substrate, a flex substrate, a semi-flex substrate, and so forth) is aligned with, and placed over balls 181 and 182 on the pinalignment fixture (holes in substrate 190 match the positions of the alignment pins such as pins 120 and 121). Next, optional release film 200, for example and without limitation, a Mylar or Teflon film, is aligned with, and placed over, structure 190 (and contactors 195 and 196) on the pinalignment fixture 1000 (holes in release film 200 match the positions of the alignment pins such as pins 120 and 121, for example and without limitation, release film 200 may have a cut-out region where the cut-out region includes an area in which the contactors are disposed so that they are not damaged during re-flow). Next, weight 210 is aligned with, and placed over, release film 200 on the pinalignment fixture 1000 to apply pressure. Next, the solder coating on balls 181 and 182 is re-flowed, for example and without limitation, by baking in an oven at a temperature in a range, for example and without limitation, from about 200° C. to about 230° C. Advantageously, polyimide film 150 holds balls 181 and 182 in place during the re-flow, and it helps support each ball during testing. During the re-flow process, weight 210 provides a force that causes the solder to flow so that the distance between substrate 190 and Probe Card 130 is determined by the size of the core of balls 181 and 182, for example and without limitation, the diameter of a Cu core of balls 181 and 182 (it should be understood that other mechanisms for applying such a force may be used to fabricate one or more further embodiments of the present invention such as, for example and without limitation, by the use of springs that are adapted to urge substrate 190 and Probe Card 130 towards each other). Thus, the rigid core of balls 181 and 182 acts as a stopper to vertical displacement of substrate 190 relative to Probe Card 130. Since three (3) points determined a plane, the plane of substrate 190 will be determined substantially by the diameter of the three largest cores (where the core sizes are expected to vary due to manufacturing tolerances). Advantageously, Method I provides a structure wherein a plane of substrate 190 is substantially parallel to a plane of Probe Card 130. Finally, the structure or lay-up comprised of connected substrate 190 and Probe Card 130 is removed from the pinalignment fixture, and release films 110 and 200 are removed.

Figure 1A:
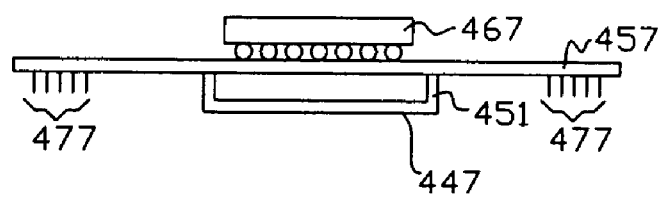
FIG. 1A is a cross sectional view that shows a stiffening mechanism connected to a Probe Card in accordance with one or more embodiments of the present invention.
Figure 1B:
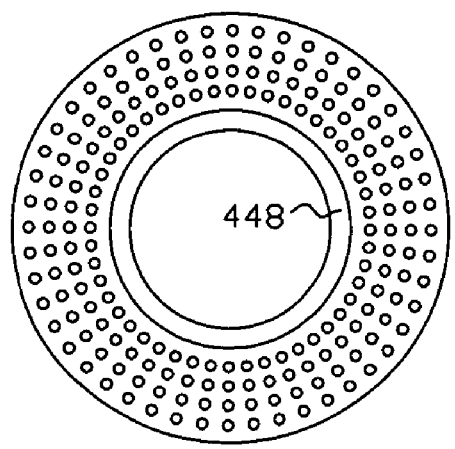
FIG. 1B is a bottom view that shows the stiffening mechanism shown in FIG. 1A.

In accordance with one or more further embodiments of the present invention, a stiffening mechanism is connected to a side of the Probe Card opposite from the side to which the substrate is connected. FIG. 1A is a cross sectional view that shows how stiffening mechanism 447 is connected to Probe Card 457 in accordance with one or more embodiments of the present invention, and FIG. 1B is a bottom view that shows stiffening mechanism 447. As shown in FIG. 1A, stiffening mechanism 447 is connected to Probe Card 457 so that substrate 467 is encompassed within an area delineated by the perimeter of stiffening mechanism 447. As further shown in FIG. 1A, the area delineated by the perimeter of stiffening mechanism 447 does not include electrical contacts 477 disposed on Probe Card 457, which electrical contacts 477 provide electrical connections between Probe Card 457 and a test interface system.

As shown in FIG. 1A, stiffening mechanism 447 includes leg structure 451 that is used to connect ring structure 448 (shown in FIG. 1B) to Probe Card 457 at a multiplicity of locations about the periphery of stiffening mechanism 447. Leg structure 451 may comprise, for example and without limitation, a number of legs, leg structure 451 may be a ring, and so forth. Stiffening mechanism 447 is connected to Probe Card 557 using a connection mechanism such as, for example and without limitation, screws and nuts. Also, in accordance with one or more alternative such embodiments, ring structure 448 shown in FIG. 1B may further include supports such as radial arms, struts, ribs, and the like. In accordance with one or more further embodiments of the present invention, stiffening mechanism 447 may be comprised of a solid plate, with or without a leg structure like leg structure 451 described above. Lastly, stiffening mechanism 447 may be fabricated from any one of a number of materials such as, for example and without limitation, as a metal, a plastic, a ceramic, and so forth. Advantageously, in accordance with such embodiments of the present invention, stiffening mechanism 447 provides support for substrate 467 during testing.

It should be understood by those of ordinary skill in the art that balls 181 and 182 utilized in the above-described embodiment of the present invention are interconnectors that provide electrical continuity between pads on the bottom or non-testing side of the substrate and pads on the top side of the Probe Card. In general, the interconnectors may be any type of electrical conductor (for example and without limitation, it is comprised of an electrical conducting material): (a) whose electrical conductivity is sufficient to satisfy design electrical requirements of a resulting structure or lay-up; and (b) that has at least a core that does not change shape as a result of applying heat during the fabrication process. In light of this, when the interconnectors are embodied as balls, such balls may be: (a) solid Cu balls; (b) solid Cu balls that are coated with eutectic solder; (c) solid Indium balls; (d) solid Indium balls that are coated with solder; (e) solid high lead solder (for example and without limitation, 97/3 or 95/5) balls; (f) solid high lead solder (for example and without limitation, 97/3 or 95/5) balls that are coated with solder; and (g) so forth. In addition, further embodiments can be fabricated wherein the core of the interconnectors (for example and without limitation, balls) is not solid, and further embodiments can be fabricated wherein the core of the interconnectors (for example and without limitation, balls) comprises a ceramic material that is embedded with a conducting material. Embodiment of such balls may be fabricated in accordance with any one of a number of methods that are well known to those of ordinary skill in the art, and one or more embodiments of such balls are commercially available.

In accordance with one or more further embodiments of the present invention, the interconnectors may be compliant conductive balls, for example and without limitation, compliant conductive plastic balls. For example, suitable conductive, compliant balls are commercially available that have a plastic core (for example and without limitation, a plastic core having a hollow center), which plastic core is surrounded or coated with: (a) a layer of Cu; (b) a layer of Cu and a layer of Ni; (c) a layer of Cu, a layer of Ni, and a layer of Au; and (d) so forth. In addition, in accordance with one or more still further embodiments of the present invention, the interconnectors may be springs (suitable springs may be obtained commercially). Advantageously, in accordance with one or more such embodiments of the present invention, such compliant, conductive balls may compress when the structure is used in a Tester and, thereby, the compliant, conductive balls may be able make up for any non-planarity of the structure as a whole.

It should be understood that further embodiments of the present invention exist wherein the interconnectors may be affixed to the substrate and to the Probe Card utilizing any one of a number of methods that are well known to those of ordinary skill in the art. For example and without limitation, if an interconnector is embodied as a solder coated Cu ball, such a solder coated ball may be affixed: (a) by re-flow; (b) by re-flow after applying flux to the substrate and/or the Probe Card; (c) by re-flow after applying conductive paste to the substrate and/or the Probe Card; (d) by re-flow after applying conductive paste to the substrate or the Probe Card and applying flux to the Probe Card or the substrate, respectively; (e) and so forth. As a further example, if an interconnector is embodied as a Cu ball or as a conductive, compliant ball such as that described above, such a ball may be affixed: (a) by re-flow after applying solder paste to the substrate and the Probe Card; (b) by curing after applying conductive paste to the substrate and the Probe Card; (c) by re-flow after applying conductive paste to the substrate or the Probe Card and applying solder paste to the Probe Card or the substrate, respectively; (d) and so forth. As a still further example, if the interconnector is embodied as a spring, such a spring may be affixed: (a) by re-flow after applying solder paste to the substrate and the Probe Card; (b) by curing after applying conductive paste to the substrate and the Probe Card; (c) by re-flow after applying conductive paste to the substrate or the Probe Card and applying solder paste to the Probe Card or the substrate, respectively; (d) and so forth.

It should also be understood that further embodiments of the present invention exist wherein: (a) no interconnector alignment film is used; (b) an interconnector alignment film is applied to the Probe Card (see the above-described embodiment where the interconnector alignment film is embodied as polyimide film 150); (c) an interconnector alignment film may be applied to the substrate in a manner that will be readily understood by one of ordinary skill in the art in light of the specification; (d) and so forth.

In accordance with one or more embodiments of the present invention, when the interconnectors are short, structures fabricated utilizing such interconnectors have short interconnection distances from IC bumps under test to the Probe Card. For example, when interconnectors are embodied as balls such as balls 181 and 182 described above having a solid Cu core with a diameter in a range, for example and without limitation, from about 5 mils to about 10 mils, structures fabricated utilizing such balls have interconnection distances from IC bumps under test to the Probe Card that are short. Advantageously, the resulting structures have electrical properties, such as, for example and without limitation, line resistance, inductance, and so forth, that are improvements over similar electrical properties for structures having longer interconnection distances.

An advantage provided by one or more of the above-described embodiments of the present invention is that the substrate may be removed from the Probe Card when the substrate becomes worn or is damaged. For example, to do this, one would remove the Probe Card from a Tester, de-solder the worn or damaged substrate utilizing any one of a number of de-soldering methods that are well known to those of ordinary skill in the art, and connect a new substrate to the Probe Card in its place. For example and without limitation, such a de-soldering method may include the use of forced hot air (the temperature being above the melting point of solder), and a suction to retrieve the substrate when the solder has melted to a sufficient degree. The new structure may then be replaced in the Tester.

The following describes another method ("Method II") for connecting a substrate to a Probe Card (i.e., for connecting BGA pads of a substrate to BGA pads of a Probe Card) in accordance with one or more embodiments of the present invention wherein, in accordance with Part I of Method II, interconnectors are connected to the substrate before the substrate is connected to the Probe Card, which substrate can be, for example and without limitation, a rigid substrate, a flex substrate, or a semi-flex substrate.

In a first, optional step of Part I of Method II, a release film (such as, for example and without limitation, a release film like that described above in conjunction with Method I) is aligned with, and placed over, a base plate of a pinalignment fixture (such as, for example and without limitation, a base plate and a pinalignment fixture like those described above in conjunction with Method I). Next, a substrate is aligned with, and placed over, the release film on the pinalignment fixture with its BGA pad side up. Next, a paste stencil mask that is fabricated in accordance with any one of a number of methods that are well known to those of ordinary skill in the art is aligned with, and placed over, the substrate on the pinalignment fixture. Next, a paste such as, for example and without limitation, a flux or a no-clean solder paste is applied onto the BGA pads of the substrate utilizing any one of a number of methods that are well known to those of ordinary skill in the art such as, for example and without limitation, methods utilizing a dispensing machine, methods utilizing screen-printing, methods utilizing a squeegee, and so forth. Also, in accordance with one or more further embodiments of the present invention, the paste may be any one of a number of conductive pastes that are well known to those of ordinary skill in the art such as, for example, and without limitation, a Ag conductive paste, a Au conductive paste, a Cu conductive paste, and so forth, or it may be any one of a number of solder pastes that are well known to those of ordinary skill in the art. Further, the paste can be a compliant, conductive paste where such compliant conductive paste may be any one of a number of such products that are well known to those of ordinary skill in the art such as, for example and without limitation, an elastomer such as a silicone elastomer having conductive particles embedded therein. The use of a compliant conductive paste may be advantageous in that the resulting structure may be able to take up vertical movements or movements in a Z-direction caused during testing by non-planarity of contactors on the substrate, pads on the substrate, pads on the Probe Card, and/or I/O contacts on the wafer. Next, the paste stencil mask is removed.

Next, a stencil (such as, for example and without limitation, a stencil like that described above in conjunction with Method I to position balls) is aligned with, and placed over, the substrate on the pinalignment fixture; the edges of the stencil could have a corral formed thereon (such as, for example and without limitation, a corral like that described above in conjunction with Method I). Next, balls having a rigid core and a solder coating (such as, for example and without limitation, balls like those described above in conjunction with Method I) are placed over the stencil, and the stencil is removed. Next, the solder coating on the balls is re-flowed (in a re-flow step such as, for example and without limitation, a re-flow step like that described above in conjunction with Method I). The resulting piece may be inspected, and re-work may take place if necessary. As one can readily appreciate from the above, Part I of Method II may be utilized, among other things, to prepare a replacement substrate for connection to a Probe Card by affixing balls to the BGA pads thereof.

It should be understood by those of ordinary skill in the art that the balls utilized in the above-described embodiment of the present invention are interconnectors that provide electrical continuity between pads on the bottom or non-testing side of the substrate and pads on the top side of the Probe Card. In general, the interconnectors may be any type of electrical conductor (for example and without limitation, it is comprised of an electrical conducting material): (a) whose electrical conductivity is sufficient to satisfy design electrical requirements of a resulting structure or lay-up; and (b) that has at least a core that does not change shape as a result of applying heat during the fabrication process. In light of this, when the interconnectors are embodied as balls, such balls may be: (a) solid Cu balls; (b) solid Cu balls that are coated with eutectic solder; (c) solid Indium balls; (d) solid Indium balls that are coated with solder; (e) solid high lead solder (for example and without limitation, 97/3 or 95/5) balls; (f) solid high lead solder (for example and without limitation, 97/3 or 95/5) balls that are coated with solder; and (g) so forth. In addition, further embodiments can be fabricated wherein the core of the interconnectors (for example and without limitation, balls) is not solid, and further embodiments can be fabricated wherein the core of the interconnectors (for example and without limitation, balls) comprises a ceramic material that is embedded with a conducting material. Embodiment of such balls may be fabricated in accordance with any one of a number of methods that are well known to those of ordinary skill in the art, and one or more embodiments of such balls are commercially available.

In accordance with one or more further embodiments of the present invention, the interconnectors may be compliant conductive balls, for example and without limitation, compliant conductive plastic balls. For example, suitable conductive, compliant balls are commercially available that have a plastic core (for example and without limitation, a plastic core having a hollow center), which plastic core is surrounded or coated with: (a) a layer of Cu; (b) a layer of Cu and a layer of Ni; (c) a layer of Cu, a layer of Ni, and a layer of Au; and (d) so forth. In addition, in accordance with one or more still further embodiments of the present invention, the interconnectors may be springs (suitable springs may be obtained commercially).

It should be understood that further embodiments of the present invention exist wherein the interconnectors may be affixed to the substrate utilizing any one of a number of methods that are well known to those of ordinary skill in the art. For example and without limitation, if an interconnector is embodied as a solder coated Cu ball, such a solder coated ball may be affixed to the substrate: (a) by re-flow; (b) by re-flow after applying flux to the substrate; (c) by re-flow after applying conductive paste to the substrate; and (d) so forth. As a further example, if an interconnector is embodied as a Cu ball or as a conductive, compliant ball such as that described above, such a ball may be affixed to the substrate: (a) by re-flow after applying solder paste to the substrate; (b) by curing after applying conductive paste to the substrate; and (c) so forth. As a still further example, if the interconnector is embodied as a spring, such a spring may be affixed to the substrate: (a) by re-flow after applying solder paste to the substrate; (b) by curing after applying conductive paste to the substrate; and (c) so forth.

It should also be understood that further embodiments of the present invention exist wherein: (a) no interconnector alignment film is used; or (b) an interconnector alignment film is applied to the substrate in a manner that will be readily understood by one of ordinary skill in the art in light of the specification.

The following describes Part II of Method II, i.e., a method for connecting a structure having balls affixed to the BGA pads thereto to the Probe Card. In a first, optional step of Part II of Method II, a release film (such as, for example and without limitation, a release film like that described above in conjunction with Method I) is aligned with, and placed over, a base plate of a pinalignment fixture (such as, for example and without limitation, a base plate and a pinalignment fixture like those described above in conjunction with Method I). Next, the Probe Card is aligned with, and placed over, the release film on the pinalignment fixture. Next, a paste stencil mask (such as, for example and without limitation, a paste stencil mask like that described above in conjunction with Part I of Method II) is aligned with, and placed over the Probe Card on the pinalignment fixture.

Next, a paste (such as, for example and without limitation, a paste like that described above in conjunction with Part I of Method II) is applied onto the pads of the Probe Card (in a paste application step such as, for example and without limitation, a paste application step like that described above in conjunction with Part I of Method II). Next, the paste stencil is removed.

Next, the substrate, with the balls facing down, is aligned with, and placed over the Probe Card on the pinalignment fixture. Next, in an optional step, a release film (such as, for example and without limitation, a release film like that described above in conjunction with Part I of Method II) is aligned with, and placed over, the structure on the pinalignment fixture. Next, a weight (such as, for example and without limitation, a weight like that described above in conjunction with Method I) is aligned with, and placed over, the release film on the pinalignment fixture. Next, the solder coating on the balls is re-flowed (in a re-flow step such as, for example and without limitation, a re-flow step like that described above in conjunction with Part I of Method II). During the re-flow process, the weight provides a force that causes the solder to flow so that the distance between the substrate and the Probe Card is determined by the size of the core of the balls. It should be understood that other mechanisms for applying a force (i.e., other than the weight) that causes the solder to flow so that the distance between the substrate and the Probe Card is determined by the size of the core of the balls may be used to fabricate one or more further embodiments of the present invention such as, for example and without limitation, by the use of springs that are adapted to urge the substrate and the Probe Card towards each other. Finally, the structure or lay-up comprised of the connected substrate and Probe Card is removed from the pinalignment fixture, and the release films are removed. In an alternative embodiment of Part II of Method II, a support film such as, for example and without limitation, a polyimide film, may be placed over the Probe Card before the paste is applied to help support the balls during testing. In addition, a stiffening mechanism like that described above may be (optionally) connected to a side of the Probe Card opposite from the side to which the substrate is connected.

It should be understood that further embodiments of the present invention exist wherein the interconnectors may be affixed to the Probe Card utilizing any one of a number of methods that are well known to those of ordinary skill in the art. For example and without limitation, if an interconnector is embodied as a solder coated Cu ball, such a solder coated ball may be affixed to the Probe Card: (a) by re-flow; (b) by re-flow after applying flux to the Probe Card; (c) by re-flow after applying conductive paste to the Probe Card; and (d) so forth. As a further example, if an interconnector is embodied as a Cu ball or as a conductive, compliant ball such as that described above, such a ball may be affixed to the Probe Card: (a) by re-flow after applying solder paste to the Probe Card; (b) by curing after applying conductive paste to the Probe Card; and (c) so forth. As a still further example, if the interconnector is embodied as a spring, such a spring may be affixed to the Probe Card: (a) by re-flow after applying solder paste to the Probe Card; (b) by curing after applying conductive paste to the Probe Card; and (c) so forth.

The following describes another method ("Method III") for connecting a structure comprised of at least two substrates to a Probe Card (i.e., for connecting BGA pads of the structure comprised of at least two substrates to BGA pads of the Probe Card) in accordance with one or more embodiments of the present invention. Due to limitations in wiring density for substrates presently available in the market, for high I/O chip applications (for example and without limitation, chip applications involving over 3,000 I/O connections) the wiring density may be insufficient to wire all contactors from the top or testing surface of a substrate through to the other side to pads that are to be connected to a Probe Card. Thus, for example and without limitation, in such high I/O chip applications, a substrate having contactors that face a wafer might be fanned-out to another substrate that is sometimes referred to as a second level substrate. Then, in accordance with one or more embodiments of the present invention, a first substrate having contactors for use in testing a circuit is connected to a second substrate using interconnectors such as, for example and without limitation, any of the interconnectors described above in conjunction with Methods I or II; and the two substrates are connected utilizing any of the embodiments described above in conjunction with Method I or Method II. Next, the structure comprised of the two substrates may be connected to the Probe Card utilizing any of the embodiments described above in conjunction with Method I or Method II. In addition, a stiffening mechanism like that described above may be (optionally) connected to a side of the Probe Card opposite from the side to which the substrate is connected.

The following describes another method ("Method IV") for connecting a flexible substrate (sometimes referred to as a "flex substrate") to a Probe Card (i.e., for connecting BGA pads of the flex substrate to BGA pads of the Probe Card) in accordance with one or more embodiments of the present invention. A suitable flex substrate may be fabricated from polyimide or from any other suitable materials that are well known to those of ordinary skill in the art. In accordance with one or more such embodiments, the flex substrate has a thickness in a range from, for example and without limitation, about 1 mil to about 3 mils to provide a predetermined degree of flexibility. The degree of flexibility that may be utilized in a particular application may be determined, for example and without limitation, readily by one of ordinary skill in the art without undue experimentation by testing.

Figure 2:
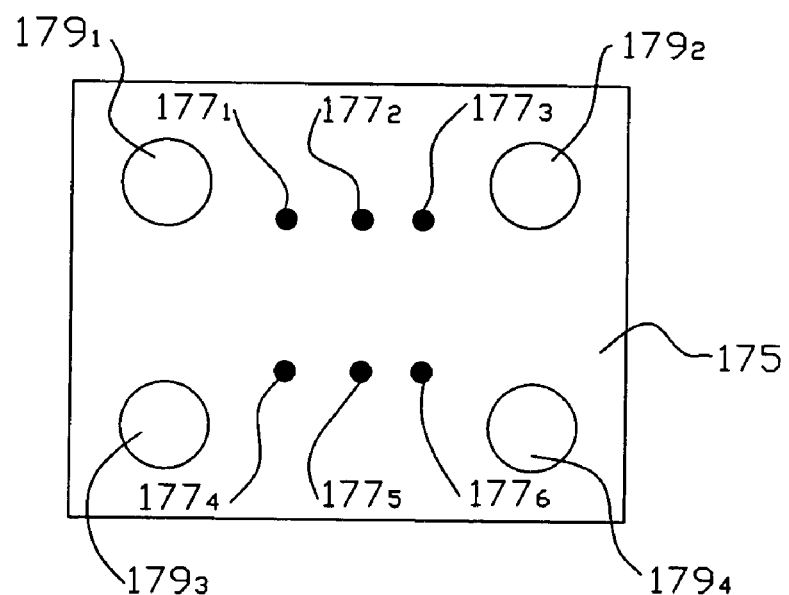
FIG. 2 is a top view that shows a portion of a flex substrate that is fabricated in accordance with one or more embodiments of the present invention.

FIG. 2 is a top view that shows a portion of flex substrate 175 that is fabricated in accordance with one or more embodiments of the present invention. As shown in FIG. 2, and in accordance with one or more such embodiments of the present invention, the BGA pads on the bottom or non-testing side of flex substrate 175 (i.e., the side opposite contactors $177_1$–$177_6$) is laid out in accordance with any one of a number of methods that are well known to those of ordinary skill in the art so that the following is true for a predetermined fraction of the BGA pads for a particular grid, for example and without, a 0.8 mm grid or a 0.65 mm grid. An area surrounded by pads $179_1$–$179_4$ (shown in phantom in FIG. 2) encompasses contactors $177_1$–$177_6$. Next, in accordance with one or more such embodiments of the present invention, the substrate is connected to the Probe Card using interconnectors such as, for example and without limitation, any of the interconnectors described above in conjunction with Methods I or II; and the substrate and the Probe Card are connected utilizing any of the embodiments described above in conjunction with Method I or Method II. Advantageously, in accordance with one or more such embodiments of the present invention, during use in a Tester or Test System, the flex substrate acts like a drum membrane. As a result, whenever a structure fabricated in accordance with this embodiment of the present invention is used in a Tester, the contactors are able to move distances that make up for at least some non-planarity in the structure itself, and/or for any non-uniformity in bump height on the wafer.

The following describes another method ("Method V") for connecting a substrate to a Probe Card (i.e., for connecting BGA pads of a substrate to BGA pads of a Probe Card) in accordance with one or more embodiments of the present invention, which substrate can be, for example and without limitation, a rigid substrate, a flex substrate, or a semi-flex substrate.

Figure 3:
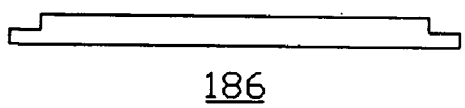
FIGS. 3–5 are cross sectional views that show substrates which have bevels or notches formed on the edges of the substrates that have been fabricated in accordance with one or more embodiments of the present invention.
Figure 4:
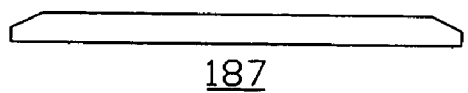
Figure 5:
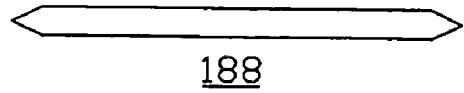

In a first step of Method V, a thickness of at least two edges of a substrate such as, for example and without limitation, a rigid substrate, is reduced by use of any one of a number of methods that are well known to those of ordinary skill in the art such as, for example and without limitation, using a router, a laser, and so forth to form bevels or notches. FIGS. 3–5 are cross sectional views that show substrates 186, 187, and 188, respectively, that have bevels or notches formed on the edges of thereof in accordance with one or more embodiments of the present invention. In accordance with one such embodiment, the thickness of the edge of the substrate is reduced to a thickness in a range, for example and without limitation, from about 0.2 mm to about 0.3 mm.

Next, compliant interconnectors such as, for example and without limitation, compliant, conductive balls or springs (such as, for example and without limitation, compliant, conductive balls or springs like those described above in conjunction with Methods I or II) are connected to the substrate utilizing any of the embodiments described above in conjunction with Part I of Method II.

Next, an optional interconnector alignment film (for example and without limitation, a polyimide film like that described above having holes in it that align to the Probe Card pads), may be affixed to the Probe Card utilizing methods described above in conjunction with, for example, Method I. Such an interconnector alignment film would act as a guide for the balls or springs.

Figure 6:
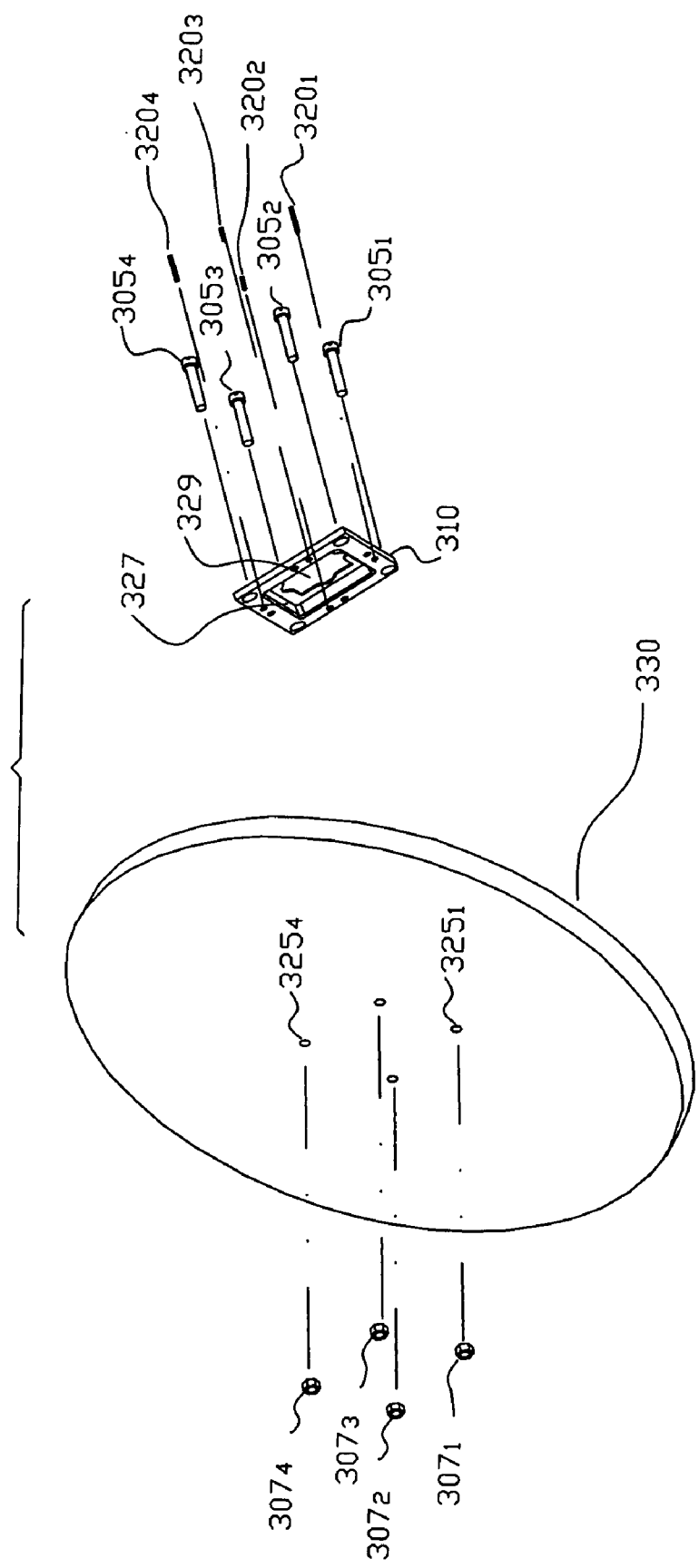
FIG. 6 shows a clamp mechanism that is fabricated in accordance with one or more embodiments of the present invention.

Next, electrical connection between pads on the substrate and pads on the Probe Card is provided by a clamp mechanism shown in FIG. 6. As shown in FIG. 6, the clamp mechanism includes: (a) substrate cover 310; (b) a connection mechanism shown, for example and without limitation, as a releasable connection mechanism comprised of screws $305_1$–$305_4$ and nuts $307_1$–$307_4$; and (c) guide pins $320_1$–$320_4$. As shown in FIG. 6, guide pins $320_1$–$320_4$ are used to align the substrate to holes $325_1$–$325_4$ in Probe Card 330, and to align substrate cover 310 over the substrate so that the balls or springs connected to the substrate are aligned with pads on Probe Card 330. As further shown in FIG. 6, substrate cover 310 includes a recess that is formed by lip 327. As further shown in FIG. 6, area 329 of the recess in substrate cover 310 is open to enable access to contactors disposed on a top side of the substrate during testing. In addition, lip 327 of substrate cover 310 is formed so that it fits over the beveled or notched edges of the substrate to hold the substrate in place when the structure is assembled. Guide pins $320_1$–$320_4$ are removed after substrate cover 310 is connected to Probe Card 330 using, for example and without limitation, a connection mechanism, for example and without limitation, a releasable connection mechanism comprised of screws $305_1$–$305_4$ and nuts $307_1$–$307_4$. In accordance with one or more such embodiments, electrical contact is ensured by pressure applied by the wafer during testing. In addition, a stiffening mechanism like that described above may be (optionally) connected to a side of the Probe Card opposite from the side to which the substrate is connected.

In an alternative such embodiment, instead of connecting the conductive, compliant balls or springs to the substrate (as described above), they are connected to Probe Card 330 using the same steps set forth above for connecting the conductive, compliant balls or springs to the substrate. In such an alternative embodiment, a polyimide film may be applied to the Probe Card to support the balls or springs as was done in Method I, however, this is not necessary. Next, electrical connection between pads on the substrate and pads on the Probe Card is provided by using the clamp mechanism shown in FIG. 6. In either case, if the substrate wears out or is damaged, it is easily replaced by releasing the connection mechanism, for example and without limitation, by removing screws $305_1$–$305_4$, thereby causing minimum equipment downtime. Advantageously, compliant balls or springs may make up for at least some non-planarity in the structure itself, and/or for any non-uniformity in bump height on the wafer.

Figure 7:
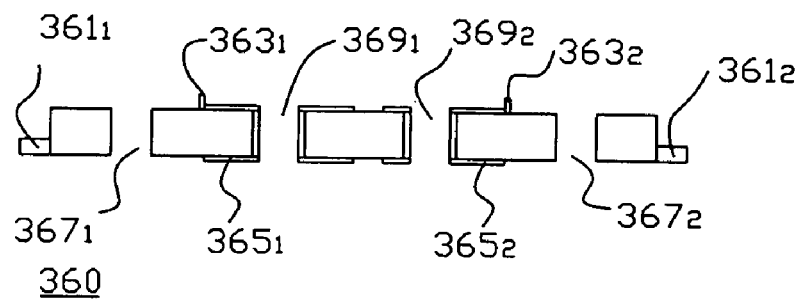
FIG. 7 is a cross sectional view that shows a chip substrate that is fabricated in accordance with one or more embodiments of the present invention.

The following describes another method ("Method VI") for connecting a substrate to a Probe Card (i.e., for connecting BGA pads of a substrate to BGA pads of a Probe Card) in accordance with one or more embodiments of the present invention. In accordance with one or more embodiments of the present invention, the substrate is a chip having spring-type contactors on a testing side, which chip is fabricated, for example and without limitation, using standard MEMS technology. In accordance with one or more such embodiments, each contractor is wired through vias on the chip to make contact with pads on the bottom side of the chip in accordance with any one of a number of methods that are well known to those of ordinary skill in the art. Advantageously, the spring type contactors on the top of the chip make up for at least some non-planarity in the structure itself, and/or for any non-uniformity in bump height on the wafer. The chip may be connected to the Probe Card using any one of the above-described embodiments. For example, FIG. 7 is a cross sectional view that shows chip substrate 360 that is fabricated in accordance with one or more embodiments of the present invention. As shown in FIG. 7, chip substrate 360 includes bevels or notches $361_1$–$361_2$; alignment vias $367_1$–$367_2$; spring-type contactors $363_1$–$363_2$; wiring $369_1$–$369_2$; and pads $365_1$–$365_2$ to enable use of Method V above.

The following describes another method ("Method VII") for connecting a substrate to a Probe Card (i.e., for connecting BGA pads of a substrate to BGA pads of a Probe Card) to provide an inventive structure in accordance with one or more embodiments of the present invention. In accordance with one or more such embodiments, the inventive structure comprises a substrate, a Probe Card, and an interconnector in the form of a connector-holder that is aligned to the substrate and the Probe Card, wherein electrical connections between pads on the substrate and pads on the Probe Cards are made through the connector-holder utilizing electrical connectors such as, for example and without limitation, Pogo pins. Advantageously, in accordance with one or more such embodiments of the present invention, inventive structures are produced that may be used cost effectively for testing because, among other reasons, the substrate may be replaced easily and rapidly with a new one when the substrate is damaged or worn.

In accordance with one or more embodiments of the present invention, a flexible, HDI substrate is fabricated utilizing, for example and without limitation, polyimide, Teflon, and so forth in accordance with any one of a number of methods that are well known to those of ordinary skill in the art. In accordance with one or more such embodiments of the present invention, the substrate has a thickness in a range, for example and without limitation, from about 2 mils to about 3 mils, and the substrate has contactors disposed on a top side of the substrate in an array that has the same pitch as that of bumps on a chip on a wafer to be tested. The contactors are wired through vias in accordance with any one of a number of methods that are well known to those of ordinary skill in the art, and the wires contact BGA pads disposed on a bottom side of the substrate, which BGA pads are disposed in a grid array that has a predetermined grid array spacing, for example and without limitation, a spacing in a range from about 0.65 mm to about 1.27 mm. Although it is not required to utilize a flex substrate to carry out Method VII, one advantage of using a flex substrate is that the resulting structure may make up for at least some non-planarity in the structure itself, and/or for any non-uniformity in bump height on the wafer. This is because movement in a Z-axis (i.e., an axis perpendicular to a plane of the substrate) is provided by the flex substrate, with or without the need for compliant connectors disposed between it and the Probe Card.

Figure 8:
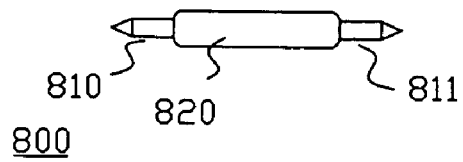
FIG. 8 shows a Pogo pin used to fabricate one or more embodiments of the present invention.

In accordance with Part I of Method VII, a connector-holder is fabricated. In accordance with one or more such embodiments, the connectors are Pogo pins, and the connector-holder for these Pogo pins is fabricated from plastic such as, for example and without limitation, ULTEM™, Torlon, and so forth. FIG. 8 shows Pogo pin 800 that is commercially available from any one of a number of sources. As shown in FIG. 8, Pogo pin 800 includes plungers 810 and 811 and barrel 820. Pogo pin 800 provides an electrical conduit between the tips of plungers 810 and 811, and as such, it is preferable that the tips of plungers 810 and 811 of Pogo pin 800 be narrow to enable better electrical contact with the pads. As such, plungers 810 and 811 may be fabricated, for example and without limitation, of gold-plated hardened steel; barrel 820 may be fabricated, for example and without limitation, of a gold-plated copper alloy; and internal springs (not shown) may be fabricated, for example and without limitation, of gold-plated piano wire.

Figure 9:
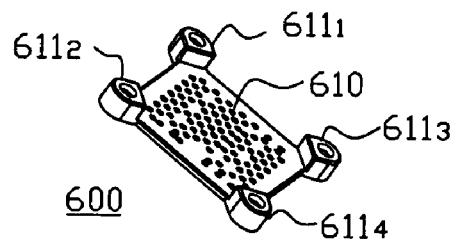
FIG. 9 is a top perspective view that shows a connector-holder bottom plate that is fabricated in accordance with one or more embodiments of the present invention.
Figure 10:
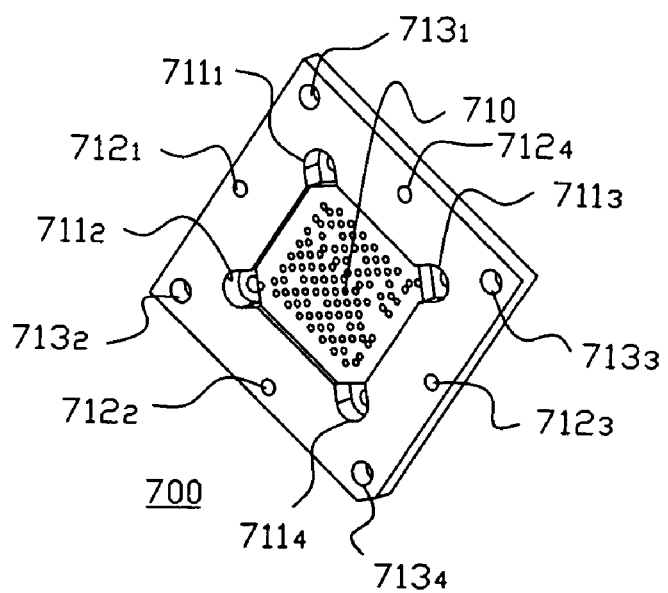
FIG. 10 is a bottom perspective view that shows a connector-holder top plate that is fabricated in accordance with one or more embodiments of the present invention.
Figure 11:
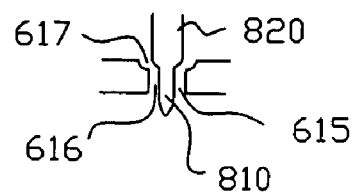
FIG. 11 is a cross sectional view that shows a hole in the connector-holder bottom plate shown in FIG. 9.
Figure 12:
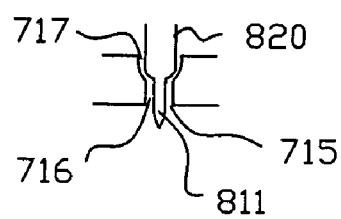
FIG. 12 is a cross sectional view that shows a hole in the connector-holder top plate shown in FIG. 10.

The connector-holder comprises a connector-holder bottom plate and a connector-holder top plate that are both fabricated, for example and without limitation, from plastic. FIG. 9 is a top perspective view that shows connector-holder bottom plate 600 that is fabricated in accordance with one embodiment of the present invention, and FIG. 10 is a bottom perspective view that shows connector-holder top plate 700 that is fabricated in accordance with one embodiment of the present invention. Connector-holder bottom plate 600 and connector-holder top plate 700 may be fabricated in accordance with any one of a number of methods that are well known to those of ordinary skill in the art such as, for example and without limitation, by injection molding, and holes may be fabricated therein in accordance with any one of a number of methods that are well known to those of ordinary skill in the art such as, for example and without limitation, by drilling. Referring to FIG. 9, the locations of the holes in array 610 of connector-holder bottom plate 600 match the locations of BGA pads on the Probe Card. Further, referring to FIG. 10, the locations of the holes in array 710 of connector-holder top plate 700 match the locations of BGA pads on the substrate. Still further, in accordance with one or more embodiments of the present invention, the holes in array 610 of connector-holder bottom plate 600 (such as hole 615 shown in FIG. 11) comprise hole 616 within hole 617 for retaining Pogo pins in place when connector-holder bottom plate 600 and connector-holder top plate 700 are connected. For example, (a) the diameter of hole 616 is larger—preferably by a small amount—(for example and without limitation, the diameter of hole 616 is in a range from about 1 mil to about 3 mils) than the diameter of plunger 810 of Pogo pin 800 shown in FIG. 8; and (b) the diameter of hole 617 larger—preferably by a small amount—than the diameter of barrel 820 of Pogo pin 800. Yet still further, in accordance with one or more embodiments of the present invention, the holes in array 710 of connector-holder top plate 700 (such as hole 715 shown in FIG. 12) comprise hole 716 within hole 717 for retaining Pogo pins in place when connector-holder bottom plate 600 and connector-holder top plate 700 are connected. For example, the (a) the diameter of hole 716 is larger—preferably by a small amount—than the diameter of plunger 811 of Pogo pin 800; and (b) the diameter of hole 717 is larger—preferably by a small amount than the diameter of barrel 820 of Pogo pin 800.

As shown in FIG. 9, connector-holder bottom plate 600 includes posts $611_1$–$611_4$. Posts $611_1$–$611_4$ include holes for connection mechanisms (for example and without limitation, releasable connection mechanisms) comprised, for example and without limitation, of screws $937_1$–$937_4$ (shown in FIG. 13) that are used to hold connector-holder bottom plate 600 and connector-holder top plate 700 together (as will be described below). As further shown in FIG. 10, connector-holder top plate 700 includes receptacles $711_1$–$711_4$. Receptacles $711_1$–$711_4$ include holes for the connection mechanisms (for example and without limitation, releasable connection mechanisms) comprised, for example and without limitation, of screws $937_1$–$937_4$ (shown in FIG. 13) that are used to hold connector-holder bottom plate 600 and connector-holder top plate 700 together (as will be described below). The shape of receptacles $711_1$–$711_4$ is such that posts $611_1$–$611_4$, mate with receptacles $711_1$–$711_4$ when connector-holder bottom plate 600 and connector-holder top plate 700 are connected to each other. As still further shown in FIG. 10, connector-holder top plate 700 further includes: (a) vias $712_1$–$712_4$ that are used for guide pins $910_1$–$910_4$ (shown in FIG. 13); and (b) holes $713_1$–$713_4$ that are used for connection mechanisms (for example and without limitation, releasable connection mechanisms) comprised, for example and without limitation, of screws $940_1$–$940_4$ (shown in FIG. 13) to hold the connector-holder in place after final assembly (as will be described below).

To assemble the connector-holder in accordance with one or more embodiments of the present invention: (a) Pogo pins are placed into the holes of array 710 of connector-holder top plate 700; (b) connector-holder bottom plate 600 is then placed over connector-holder top plate 700; and (c) as indicated in FIG. 13, connector-holder bottom plate 600 is connected to connector-holder top plate 700 by screwing connector-holder bottom plate 600 into connector-holder top plate 700 at four (4) corners using screws $937_1$–$937_4$.

In accordance with Method VII, vias are formed for guide pins $910_1$–$910_4$ (shown in FIG. 13) in the substrate and the Probe Card in accordance with any one of a number of methods that are well known to those of ordinary skill in the art.

Figure 13:
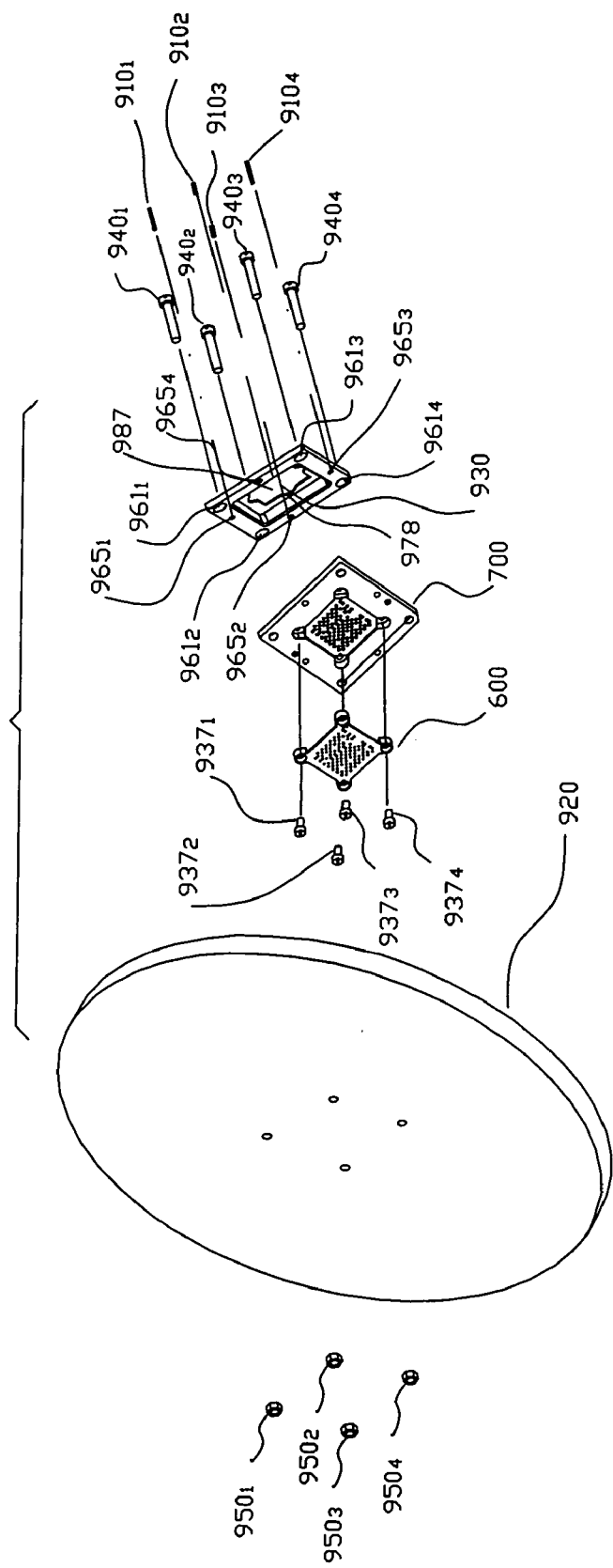
FIG. 13 is an exploded view that shows a portion of a structure used to test circuits that is fabricated in accordance with one or more embodiments of the present invention.

FIG. 13 is an exploded view that shows a portion of a structure used to test circuits that is fabricated in accordance with one or more embodiments of the present invention. Clamp 930 (a bottom perspective view of clamp 930 is shown in FIG. 13) includes: (a) vias $965_1$–$965_4$ that are used for guide pins $910_1$–$910_4$ (shown in FIG. 13); and (b) holes $961_1$–$961_4$ that are used for screws $940_1$–$940_4$ (shown in FIG. 13) to hold the connector-holder and the substrate in place on Probe Card 920 (as will be described below). As shown in FIG. 13, clamp 930 includes a recess that is formed by lip 978. As further shown in FIG. 13, area 987 of the recess in clamp 930 is open to enable access to contactors disposed on a top side of the substrate during testing. In addition, lip 978 is formed so that it fits over, and may make contact with, any bevels or notches in the edges of the substrate when the structure is assembled. Clamp 930 is fabricated, for example and without limitation, from plastic in accordance with any one of a number of methods that are well known to those of ordinary skill in the art such as, for example and without limitation, by injection molding, and holes may be fabricated therein in accordance with any one of a number of methods that are well known to those of ordinary skill in the art such as, for example and without limitation, by drilling.

In accordance with one embodiment of Part II of Method VII, the substrate is connected to the connector-holder fabricated in accordance with Part I of Method VII. In a first optional step of this embodiment of Part II of Method VII, a thickness of at least two edges of a substrate is reduced by use of any one of a number of methods that are well known to those of ordinary skill in the art such as, for example and without limitation, using a router, a laser, and so forth to form bevels or notches like those fabricated in accordance with Method V. The thickness of the routed edges is a function of the Z-movement of the Pogo pins used to fabricate the connector-holder described above.

Next, in another optional step of this embodiment of Part II of Method VII, a release film such as, for example and without limitation, a release film like that described above in conjunction with Method I) is aligned with, and placed over, a base plate of a pinalignment fixture (such as, for example and without limitation, a base plate and a pinalignment fixture like those described above in conjunction with Method I). Next, a substrate is aligned with, and placed over, the release film on the pinalignment fixture with its BGA pads side up. Next, a paste stencil mask that is fabricated in accordance with any one of a number of methods that are well known to those of ordinary skill in the art is aligned with, and placed over, the substrate on the pinalignment fixture. Next, a paste such as, for example and without limitation, a no-clean solder paste is applied onto the BGA pads of the substrate utilizing any one of a number of methods that are well known to those of ordinary skill in the art such as, for example and without limitation, methods utilizing a dispensing machine, methods utilizing screen-printing, methods utilizing a squeegee, and so forth. Also, in accordance with one or more further embodiments of the present invention, the paste may be any one of a number of conductive pastes that are well known to those of ordinary skill in the art such as, for example, and without limitation, a Ag conductive paste, a Au conductive paste, a Cu conductive paste, and so forth, or it may be any one of a number of solder pastes that are well known to those of ordinary skill in the art. Further, the paste can be a compliant, conductive paste where such compliant conductive paste may be any one of a number of such products that are well known to those of ordinary skill in the art such as, for example and without limitation, an elastomer such as a silicone elastomer having conductive particles embedded therein. Next, the paste stencil mask is removed.

Next, in accordance with this embodiment of Part II of Method VII, a connector-holder fabricated in accordance with Part I of Method VII is pinaligned (using two or more of guide pins $910_1$–$910_4$ shown in FIG. 13) to the substrate fabricated in accordance with Part II of Method VII. Next, the resulting substrate structure is re-flowed or cured, depending on the type of paste used, to connect the Pogo pins to the BGA pads on the substrate.

Next, two or more of guide or dowel pins $910_1$–$910_4$ are used to align the resulting substrate structure with, and place the resulting substrate structure over, Probe Card 920 so that the tips of the Pogo pins align with the pads on Probe Card 920. Finally, clamp 930 is aligned with, and placed over, Probe Card 920 utilizing two or more of guide or dowel pins $910_1$–$910_4$, and clamp 930 is connected to Probe Card 920 utilizing screws $940_1$–$940_4$ (screws $940_1$–$940_4$ also pass through the connector-holder) and nuts $950_1$–$950_4$, thereby holding the final assembly in place. Next, the guide pins are removed. In addition, a stiffening mechanism like that described above may be (optionally) connected to a side of the Probe Card opposite from the side to which the substrate is connected.

Advantageously, using a flex substrate and Pogo pins in accordance with the above-described embodiments enables bump height non-uniformity or non-planarity of the structure to be made up by movement in a Z-axis during testing. Further, a short interconnection distance between the substrate and the Probe Card obtained from the use of small Pogo pins can create better electrical properties than those of structures produced using prior art methods. Still further, in accordance with the above-described embodiments, whenever the flex substrate wears out or becomes damaged, the Pogo pins can be removed from it by de-soldering in accordance with any one of a number of methods that are well known to those of ordinary skill in the art. Then a new substrate may be incorporated into the assembly, and the Probe Card may be reused.

In accordance with one or more alternative embodiments of Method VII described above, the substrate is laid out in accordance with any one of a number of methods that are well known to those of ordinary skill in the art so that all the wiring to the bottom side of the substrate (i.e., the side opposite from the contactors) is routed to a periphery of the substrate. As a result, in accordance with this embodiment of the present invention, there are no pads underneath contactors disposed in a region of the substrate, for example and without limitation, a center of the substrate. Next, a compliant substance such as, for example and without limitation, a compliant elastomer, is applied to the bottom side of the substrate, in the central area, in accordance with any one of a number of methods that are well known to those of ordinary skill in the art such as, for example and without limitation, by screen printing or stenciling methods. The compliant substance would be thick enough so that it contacts connector-holder top plate 700 when the substrate is connected to the connector-holder as described above. Since the pads on the bottom side of the substrate are on the periphery of the substrate, so too are the Pogo pins held by the connector-holder disposed about the periphery of the substrate. As a result, whenever the contactors on the substrate move up and down during testing, the substrate can flex sufficiently to make up for at least some non-planarity in the structure itself, and/or for any non-uniformity in bump height on the wafer. In addition, in accordance with one or more further such alternative embodiments, the connector-holder has a hole in the middle, and the compliant substance applied to the bottom side of the substrate is made so thick that it extends through to the Probe Card, which Probe Card may also be milled to provide a recessed area into which the substance is seated.

The following describes another method ("Method VIII") for connecting a substrate to a Probe Card (i.e., for connecting BGA pads of a substrate to BGA pads of a Probe Card) in accordance with one or more embodiments of the present invention, which substrate can be, for example and without limitation, a rigid substrate, a semi-rigid substrate, a silicon/glass substrate having MEMS-type springs, and so forth.

In accordance with Part I of Method VIII, an interconnector in the form of a connector-holder is fabricated in accordance with Part I of Method VII. Next, vias are formed for guide pins in the substrate and the Probe Card in accordance with any one of a number of methods that are well known to those of ordinary skill in the art.

Figure 15:
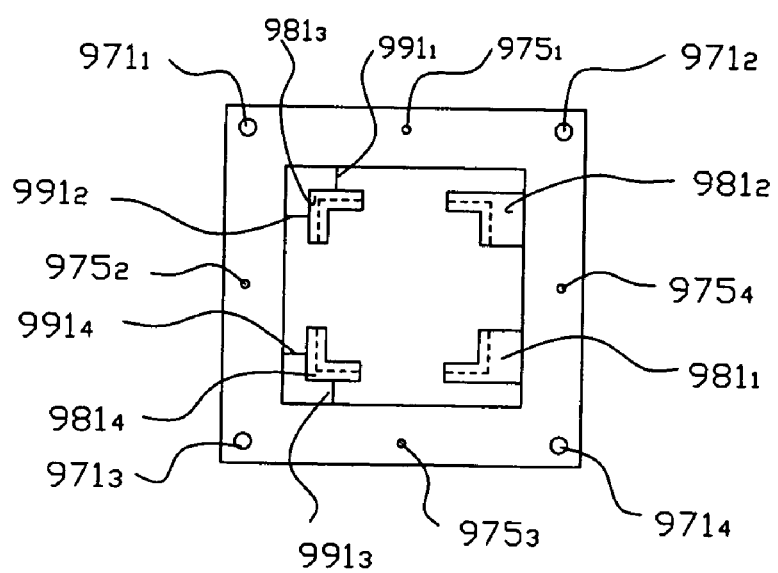
FIG. 15 is a top view of a clamp that is fabricated in accordance with one or more embodiments of the present invention.

Next, clamp 960 is fabricated, for example and without limitation, from plastic in accordance with any one of a number of methods that are well known to those of ordinary skill in the art such as, for example and without limitation, by injection molding. Holes may be fabricated in clamp 960 in accordance with any one of a number of methods that are well known to those of ordinary skill in the art such as, for example and without limitation, by drilling. FIG. 15 is a top view that shows clamp 960. As shown in FIG. 15, clamp 960 includes: (a) vias $975_1$–$975_4$ that are used for guide pins (to be described below); and (b) holes $971_1$–$971_4$ that are used for connection mechanisms, for example and without limitation, releasable connection mechanisms comprised of screws, (to be described below) to connect clamp 960 to the connector-holder. As further shown in FIG. 15, clamp 960 includes stationary structures $981_1$ and $981_2$ which have lips (shown in phantom) that are disposed to cover a portion of the edges (see below) of the substrate and to engage (optional) grooves in the edges of the substrate. As further shown in FIG. 15, clamp 960 includes a substrate alignment mechanism. In particular, as further shown in FIG. 15, clamp 960 includes laterally movable structures $981_3$ and $981_4$ which have lips (shown in phantom) that are disposed to cover at least a portion of the beveled edges (see below) of the substrate and to engage (optional) grooves in the beveled edges of the substrate. As further shown in FIG. 15, clamp 960 includes springs $991_1$ and $991_2$ and springs $991_3$ and $991_4$. Springs $991_1$ and $991_2$ urge movable structure $981_3$ toward the center of clamp 960, and springs $991_3$ and $991_4$ urge movable structure $981_4$ toward the center of clamp 960. In use, when clamp 960 is placed over the substrate (see below), stationary structures $981_1$ and $981_2$ and movable structures $981_3$ and $981_4$ engage the edges of the substrate (for example and without limitation, in grooves disposed therein), and springs $991_1$, $991_2$, $991_3$, and $991_4$ provide lateral forces that help align the substrate. Those of ordinary skill in the art should understand that (although the embodiment described above in conjunction with FIG. 15 indicated that structures $981_1$ and $981_2$ were stationary and that structures $981_3$ and $981_4$ were laterally movable) further embodiments exist where all or some of structures $981_1$–$981_4$ are movable. For example and without limitation, in accordance with one or more further embodiments, structures $981_1$ and $981_4$ are movable and structures $981_2$ and $981_3$ are stationary, or vice versa.

Figure 14:
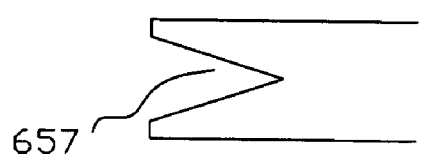
FIG. 14 is a cross sectional view that shows a groove cut into a side of a substrate that is fabricated in accordance with one or more embodiments of the present invention.

In accordance with Part II of Method VIII, first, a thickness of at least two edges of the substrate is reduced by use of any one of a number of methods that are well known to those of ordinary skill in the art such as, for example and without limitation, using a router, a laser, and so forth to form bevels or notches like those fabricated in accordance with Method V. The thickness of the routed edges is a function of the Z-movement of the Pogo pins used to fabricate the connector-holder. Next, optional grooves, for example and without limitation, V-shape grooves are cut into two or more sides of the substrate in accordance with any one of a number of methods that are well known to those of ordinary skill in the art. FIG. 14 is a cross sectional view that shows an edge of the substrate with groove 657.

Next, guide or dowel pins are used to align the connector-holder with the Probe Card (as a result, Pogo pins in the connector-holder are connected to pads on the Probe Card. Once the connector-holder is aligned with respect to the Probe Card, the connector-holder is connected to the Probe Card using a connection mechanism, for example and without limitation, a releasable connection mechanism comprised of screws and nuts. For example, four (4) screws are inserted through the connector-holder and the Probe Card, and four (4) nuts are secured to the screws to connect the connector-holder and the Probe Card. Next, the guide or dowel pins are removed. Next, the substrate is aligned with, and placed over, the connector-holder (two or more guide or dowel pins are used to align the Pogo pins of the connector-holder with the BGA pads of the substrate). Next, clamp 960 is aligned with, and placed over, the substrate (two or more guide or dowel pins are use to align the clamp and the substrate), and clamp 960 is connected to the connector-holder using a connection mechanism, for example and without limitation, a releasable connection mechanism comprised of screws. For example, four (4) screws are screwed into the connector-holder. As described above, clamp 960 confines vertical movement of the substrate as well as providing lateral alignment by spring action. In addition, a stiffening mechanism like that described above may be (optionally) connected to a side of the Probe Card opposite from the side to which the substrate is connected. The Probe Card/substrate assembly is now ready for use in testing circuits.

In accordance with one or more further such embodiments of the present invention, a connector-holder is not fixedly connected to the Probe Card, and a clamp is connected directly to the Probe Card, which clamp would include a connector-holder alignment mechanism and a substrate alignment mechanism. For example and without limitation, in accordance with such further embodiments, the connector-holder alignment mechanism and the substrate alignment mechanism may be fabricated utilizing movable structures and springs like those described above in conjunction with clamp 960.

In accordance with one or more such embodiments, advantageously, whenever the substrate wears out or becomes damaged, it is replaced while the Pogo pins stay in place and get reused. If a Pogo pin is damaged, it can easily be pulled out of the connector-holder and be replaced. Advantageously, since neither the connector-holder nor the Pogo pins get replaced (unless a Pogo pin is damaged), there is minimum downtime required for replacing the substrate. In addition, a short interconnection distance between the substrate and the Probe Card obtained from the use of small Pogo pins can create better electrical properties than those of structures produced using prior art methods.

Note that if one substrate is not sufficient to handle the wiring density required for a circuit or IC having lots of I/O (for example and without limitation, a circuit having >3000 I/O connections), a composite substrate may be fabricated which comprises a first level substrate and a second level substrate that is connected to the first level substrate. Electrical connection between the first level substrate and the second level substrate can be made using any of the methods described above utilizing interconnectors such as, for example and without limitation, any of the interconnectors described above in conjunction with Methods I or II; and the two substrates are connected utilizing any of the embodiments described above in conjunction with, for example and without limitation, Method I or Method II. The composite substrate may then be connected to the Probe Card utilizing any of the methods described above.

One or more further embodiments of the present invention relate to a Probe Card that can function as a universal Probe Card, i.e., a Probe Card that may be useful in a number of different testing applications. In accordance with such one or more further embodiments, the Probe Card has a large number of pads disposed in a grid having, for example and without limitation, at least about four hundred (400) pads and having, for example and without limitation, a 0.8 mm pad pitch. As is well known, for a typical Probe Card, connections to analog I/O on a chip are grouped and connected to one cluster of pins on the outside of the Probe Card, and connections to digital I/O on the chip are grouped and connected to another cluster of pins on the outside of the Probe Card. Thus, in accordance with one such further embodiment of the present invention, the above described universal Probe Card would allocate a one fraction of its pads to analog I/O and another fraction of its pads to digital I/O. The allocation would be such that there would be a sufficient number of connections to analog I/O and to digital I/O to satisfy the required number of connections for a number of different chip designs. This would enable the Probe Card to be used in a number of different testing applications. Then, in accordance with one such further embodiment of the present invention, a substrate specific to the particular chip being tested would be used with the universal Probe Card. Advantageously, the various specific substrates useful for the various specific applications would be connected to the universal Probe Card utilizing one or more of the methods described herein.

Figure 16:
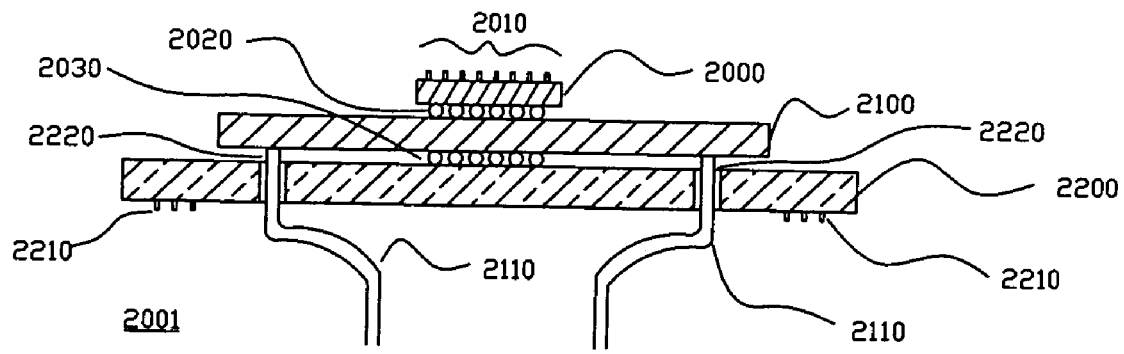
FIG. 16 is a cross sectional view that shows a structure for testing circuits that is fabricated in accordance with one or more embodiments of the present invention.

One or more further embodiments of the present invention relate to a structure for testing circuits that is fabricated in accordance with one or more embodiments of the present invention. FIG. 16 is a cross sectional view that shows structure 2001 that is fabricated in accordance with one or more embodiments of the present invention. As shown in FIG. 16, structure 2001 comprises substrate 2000, RF interface board 2100, and Probe Card 2200. As further shown in FIG. 16, substrate 2000 includes array 2010 of contactors on a top or testing side thereof (i.e., a side that contacts an IC on the wafer). As further shown in FIG. 16, RF interface board 2100 is connected, on a top side thereof, to BGA pads disposed on a bottom side of substrate 2000 by means of, for example and without limitation, conductive balls 2020. As further shown in FIG. 16, RF interface board 2100 is further connected so that: (a) non-RF I/O BGA pads on a bottom side of RF interface board 2100 are connected to BGA pads on a top side of Probe Card 2200 by means of, for example and without limitation, conductive balls 2030, and (b) RF coaxial cable connectors (not shown) on a bottom side of RF interface board 2100 are connected to RF test coaxial cables 2110. As further shown in FIG. 16, RF test coaxial cables 2110 are routed through channels 2220 in Probe Card 2200.

Figure 17:
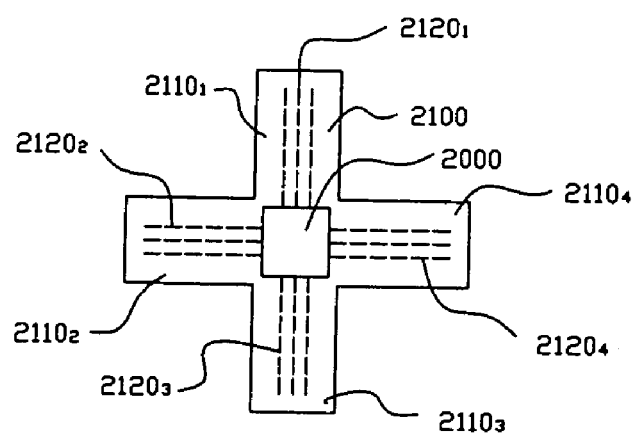
FIG. 17 is a top view that shows a substrate and an RF interface board that are used in the structure shown in FIG. 16.

FIG. 17 is a top view that shows substrate 2000 and RF interface board 2100 of structure 2001. As shown in FIG. 17, RF interface board 2100 includes wing structures $2110_1$–$2110_4$. As further shown in FIG. 17, wing structures $2110_1$–$2110_4$ include wiring groups $2120_1$–$2120_4$ (shown in phantom), respectively. In accordance with one or more embodiments of the present invention, wiring groups $2120_1$–$2120_4$ provide electrical connections from RF I/O BGA pads on a top side of RF interface board 2100 to RF coaxial cable connectors (not shown) on a bottom side of RF interface board 2100. In addition, RF interface board 2100 includes wiring (not shown) that provides electrical connections from non-RF I/O BGA pads on the top side of RF interface board 2100 to non-RF I/O BGA pads on the bottom side of RF interface board 2100. RF interface board 2100 may be fabricated in accordance with any one of a number of methods that are well known to those of ordinary skill in the art using materials utilized to fabricate a rigid substrate, a semi-flex substrate, a flex substrate, a silicon/glass structure, and so forth, and using any one of a number of RF coaxial cable connectors that are well known to those of ordinary skill in the art. Note that although RF interface board 2100 described above includes wing structures $2110_1$–$2110_4$ shown in FIG. 17, further embodiments of the present invention exist in which structures used to connect to RF I/O may take any one of a number of forms such as, for example and without limitation, a single board whose periphery carries RF connectors, one or more wings, and so forth.

In use for testing, structure 2001 might be connected to, for example and without limitation, a Pogo Tower (a Pogo Tower is a type of connector that is well known to those of ordinary skill in the art and which is used in some commercial test systems to provide an interface to a Probe Card). For example, in such an arrangement, a top side of the Pogo Tower would be connected to non-RF test connectors 2210 (shown in FIG. 16) on a bottom side of Probe Card 2200 in a well known manner, and a bottom side of the Pogo Tower would be connected to a test system interface board in a well known manner. Further, RF test coaxial cables 2110 (which are routed through channels 2220 in Probe Card 2200) would be further routed through a central aperture in the Pogo Tower (many commercial embodiments of a Pogo Tower are fabricated to have an aperture in the center), and would be connected directly to the test system interface.

In accordance with one or more such embodiments of the present invention, substrate 2000 may be any of the substrates that have been described herein such as, for example and without limitation, a rigid substrate, a flex substrate, a semi-flex substrate, a silicon/glass substrate (for example and without limitation, a silicon/glass structure that includes MEMS-type spring contactors), and so forth. In addition, Probe Card 2200 may be any one of a number of Probe Cards that are well known to those of ordinary skill in the art. Channels 2220 in Probe Card 2200 may be fabricated in accordance with any one of a number of methods that are well known to those of ordinary skill in the art such as, for example and without limitation, by drilling. Further, channels 2220 are made large enough to enable the desired number of coaxial cables to fit through.

In fabricating structure 2001 described above, one may utilize any of the above-described methods to connect substrate 2000 to RF interface board 2100, and to connect RF interface board 2100 to Probe Card 2200. Thus. as one can readily appreciate from the above, and in accordance with one or more such embodiments of the present invention, the coaxial cables are connected close to contactors 2010, and the Pogo Tower is bypassed, thereby decreasing an electrical path between contactors on the substrate and the Test System. As a result, it is expected that better electrical performance will be achieved when using the inventive structures when compared to that of structures fabricated in accordance with the prior art.

Although various embodiments that incorporate the teachings of the present invention have been shown and described in detail herein, those skilled in the art can readily devise many other varied embodiments that still incorporate these teachings.

What is claimed is:

1. A method for fabricating a structure useful for testing circuits that comprises steps of:
aligning a first side of a connector-holder comprised of electrical connectors having retractable ends that are extendable out of the first side of the connector-holder and having retractable ends that are extendable out of a second side of the connector-holder with a substrate;
connecting the ends that are extendable out of the first side to pads on the substrate;
aligning the second side of the connector-holder with a probe card;
aligning a clamp with the probe card, the clamp being adapted to fit over the substrate and the connector-holder; and
connecting the clamp to the probe card through the connector-holder.

2. The method of claim 1 that further comprises steps of:
applying conductive paste to the pads on the substrate;
wherein the step of connecting comprises curing the conductive paste.

3. The method of claim 1 wherein the electrical connectors are pogo pins.

4. The method of claim 1, wherein the substrate has contours in at least two edges.

5. The method of claim 4 wherein the clamp further includes a lip that is adapted to fit over and engage the contours.

6. The method of claim 4, wherein the contours comprise a bevel formed on the substrate.

7. The method of claim 4, wherein the contours comprise a notch formed on the substrate.

8. The method of claim 1 wherein the substrate is laid out so that there are no pads underneath contactors in a region of the substrate; and
the method further comprises steps of applying a compliant substance to a bottom side of the substrate.

9. The method of claim 8 wherein the compliant substance contacts the connector-holder when the substrate is connected to the connector-holder.

10. The method of claim 1 wherein the connector-holder comprises a connector-holder bottom plate and a connector-holder top plate, which connector-holder bottom plate and which connector-holder top plate are connected to each other to retain the electrical connectors therebetween.

11. The method of claim 1, wherein the substrate comprises an interposer that provides a fan-out between electrical terminals of a circuit to be tested and electrical terminals of the probe card.

12. The method of claim 1, wherein the substrate has contactors on a side opposite to a side of the substrate having the pads that are connected to the electrical connectors.

* * * * *